United States Patent [19]

Aihara

[11] Patent Number: 5,701,599
[45] Date of Patent: Dec. 23, 1997

[54] BROADCAST RECEIVING APPARATUS HAVING SELECTION FUNCTION OF GOOD RECEPTION CONDITION IN DESIGNATED PROGRAM ITEM

[75] Inventor: Fumikazu Aihara, Kita-machi, Japan

[73] Assignee: Casio Computer Co., Ltd., Tokyo, Japan

[21] Appl. No.: 917,599

[22] Filed: Jul. 23, 1992

[30] Foreign Application Priority Data

| Jul. 30, 1991 | [JP] | Japan | 3-214324 |
| Sep. 25, 1991 | [JP] | Japan | 3-274707 |
| Sep. 25, 1991 | [JP] | Japan | 3-274713 |
| Oct. 17, 1991 | [JP] | Japan | 3-298104 |

[51] Int. Cl.$^6$ .................................................. H04B 1/16
[52] U.S. Cl. ........................ 455/186.1; 455/158.4; 455/166.2
[58] Field of Search .............. 455/161.3, 166.1, 455/166.2, 186.1, 185.1, 184.1, 186.2, 67.7, 226.4, 158.4

[56] References Cited

U.S. PATENT DOCUMENTS

| 4,461,036 | 7/1984 | Williamson et al. | 455/166.1 X |
| 4,521,915 | 6/1985 | Baker et al. | 455/166.2 X |
| 4,525,866 | 7/1985 | Templin | 455/166.2 X |
| 4,641,367 | 2/1987 | Van Deursen et al. | 455/161.2 |
| 4,969,209 | 11/1990 | Schwob | 465/186.1 |
| 5,073,976 | 12/1991 | Kennedy | 455/161.3 |
| 5,161,253 | 11/1992 | Hirano | 455/161.3 |
| 5,345,606 | 9/1994 | Duckeck et al. | 455/186.1 |

*Primary Examiner*—Edward F. Urban
*Attorney, Agent, or Firm*—Frishauf, Holtz, Goodman, Langer & Chick

[57] ABSTRACT

Whether or not the reception condition of a received broadcast is good is detected by a reception condition detection unit. If it is detected that the reception condition is good, the broadcast content in the good reception condition is displayed on a display unit. However, if it is detected that the reception condition is not good, another broadcast content in a good reception condition is automatically received, and the broadcast content in the good reception condition is displayed on the display unit. The reception condition is evaluated in a plurality of stages depending on the reception condition of the received broadcast, and the evaluation result is displayed. If it is detected that the reception condition is not good, power supply to an apparatus main body is stopped after an elapse of a predetermined period of time. After an elapse of another predetermined period of time, the reception condition detection unit detects again whether or not a good reception condition is attained. If it is detected that a good reception condition is attained, the power supply is restarted.

4 Claims, 7 Drawing Sheets

FIG. 3

| ITEM NAME 1 ||
|---|---|
| CHANNEL 1-1 | PROGRAM 1-1 |
| CHANNEL 1-2 | PROGRAM 1-2 |
| — — — — — — — — ||
| ITEM NAME 2 ||
| CHANNEL 2-1 | PROGRAM 2-1 |
| CHANNEL 2-2 | PROGRAM 2-2 |
| — — — — — — — — ||
| — — — — — — — — ||
| — — — — — — — — ||
| — — — — — — — — ||
| RECEPTION DATA PAGE-1 ||
| — — — — — ||
| RECEPTION DATA PAGE-100 ||

BROADCAST RECEIVING APPARATUS HAVING SELECTION FUNCTION OF GOOD RECEPTION CONDITION IN DESIGNATED PROGRAM ITEM

BACKGROUND OF THE INVENTION

1. Field of the Invention

The present invention relates to a broadcast receiving apparatus such as a teletext receiving apparatus, a television broadcast receiving apparatus, or a radio receiving apparatus and, more particularly, to a broadcast receiving apparatus, which can quickly and reliably tune in for or select a broadcast program associated with desired information in a good reception condition.

2. Description of the Related Art

Broadcast receiving apparatuses such as a teletext receiving apparatus, a television broadcast receiving apparatus, a radio receiving apparatus, and the like have been developed, and are widely commercially available.

In a conventional broadcast receiving apparatus of this type, when a received broadcast wave of a given broadcasting channel cannot be satisfactorily received in a good reception condition, a user must operate a tuning operation member to receive a broadcast wave of another broadcasting channel.

In the conventional broadcast receiving apparatus, a listener or viewer decides a reception condition by actually confirming noise in an image or sound by himself or herself. Thus, it takes a long time to determine whether or not a reception condition is proper, and it takes another long time to select another channel in a proper reception condition.

In particular, in a receiving apparatus which can receive a teletext, it is important to quickly and properly recognize a reception condition depending on the reception condition so as to quickly and accurately acquire character information. Thus, a demand has arisen for output of adequate information of a reception condition.

Furthermore, in the conventional broadcast receiving apparatus, since a selected program is output independently of the reception condition, character information or data included in the program cannot be normally obtained when the reception condition is poor, resulting in wasteful power consumption.

In particular, in a receiving apparatus which can receive a teletext, if received character data include many errors, character data stored in a memory is poor and cannot be used, and electrical power is wasted.

In recent years, a broadcast receiving apparatus with a reservation function is commercially available. With this apparatus, since the power switch is automatically turned on at reserved time to start reception, the power switch is often turned on while a listener or viewer is absent. In this case, the listener or viewer cannot turn off the power switch or cannot re-tune in for a program due to a poor reception condition, resulting in further wasteful power consumption.

SUMMARY OF THE INVENTION

The present invention has been made to solve the conventional problems.

It is, therefore, an object of the present invention to provide a broadcast receiving apparatus, which can easily and quickly select a broadcast program to be watched or listened in a good reception condition.

It is another object of the present invention to provide a broadcast receiving apparatus which can automatically select a target broadcast program without requiring a cumbersome tuning or selecting operation.

It is still another object of the present invention to provide a broadcast receiving apparatus which can automatically and sequentially select broadcast programs in a good broadcast reception condition in the order of higher priority.

It is still another object of the present invention to provide a broadcast receiving apparatus which can save power consumption of the entire apparatus.

It is still another object of the present invention to provide a broadcast receiving apparatus which can quickly and adequately confirm whether or not the broadcast reception condition is proper.

In order to achieve the above objects, one arrangement of the present invention comprises: reception means capable of receiving broadcast waves; selecting means for selecting a broadcast wave of a broadcasting channel from the broadcast waves received by the reception means; storage means for storing broadcast program data of the broadcasting channel to be selected by the selecting means according to a selecting priority order; reception condition detection means for detecting whether or not a reception condition of the broadcast wave received by the reception means is good; and control means, responsive to the detection of the reception condition detection means that the reception condition of the broadcast wave of the received broadcasting channel is good, for controlling the selecting means to select the broadcast wave of the received broadcasting channel, and for, when the reception condition detection means detects that the reception condition is not good, controlling the selecting means to select a broadcast wave of a broadcasting channel having the next priority order according to the priority order stored in the storage means, and to output broadcast program data of the selected broadcasting channel.

Another arrangement of the present invention further comprises informing means for, when the reception condition detection means detects, under the control of the control means, that the reception condition of the broadcast wave of the broadcasting channel having the next priority order is not good, informing that the reception condition of the broadcasting channel is not good.

Still another arrangement of the present invention comprises: reception means capable of receiving broadcast waves; selecting means for selecting a broadcast wave of one broadcasting channel from the broadcast waves received by the reception means; storage means for storing a plurality of sets of selecting program data each having channel number data indicating a broadcasting channel to be selected by the selecting means and broadcast program data indicating a broadcast program to be broadcasted by a corresponding broadcasting channel in units of a plurality of items defining types of broadcast programs; item designation means for designating one of the plurality of items stored in the storage means; reception condition detection means, responsive to the item selection by the item designation means, for detecting whether or not a reception condition of a broadcast wave from one of the broadcasting channels indicated by the plurality of sets of selecting program data in the item is good; and control means for, when the reception condition detection means detects that the reception condition of the broadcast wave from the one broadcasting channel is good, controlling the selecting means to select the broadcast wave of the one broadcast program, and to output broadcast program data of the selected broadcast program, and for, when the reception condition detection means detects that the reception condition is not good, controlling the selecting means to select a broadcast wave of a broadcast program indicated by another selecting program data, and to output a broad-cast program data of the selected broadcast program.

Still another arrangement of the present invention further comprises informing means for, when the reception condition detection means detects, under the control of the control means, that the reception condition of the broadcast wave of the broadcasting program indicated by another selecting program data is not good, informing that the reception condition of the broadcast wave is not good.

Still another arrangement of the present invention comprises: reception means capable of receiving broadcast waves; selecting means for selecting a broadcast wave of one broadcasting channel from the broadcast waves received by the reception means; storage means for storing a plurality of sets of selecting program data each having channel number data indicating a broadcasting channel to be selected by the selecting means and broadcast program data indicating a broadcast program to be broadcasted by the corresponding broadcasting channel in units of a plurality of items defining types of broadcast programs; item designation means for designating one of the plurality of items stored in the storage means; reception condition detection means, responsive to the item selection by the item designation means, for detecting whether or not a reception condition of a broadcast wave from one of the broadcasting channels indicated by the plurality of sets of selecting program data in the item is good; and control means for, when the reception condition detection means detects that the reception condition of the broadcast wave from the one broadcasting channel is good, controlling the selecting means to select the broadcast wave of the one broadcast program, and to output broadcast program data of the selected broadcast program, for, when the reception condition detection means detects that the reception condition is not good, controlling to receive the broadcast waves of a plurality of broadcast programs indicated by the remaining selecting program data until the reception means receives a good broadcast wave of the broadcast waves of the plurality of broadcast programs indicated by the remaining selecting program data, and for, when the reception condition detection means detects that a reception condition of the received broadcast wave is good, controlling the selecting means to select the corresponding broadcast wave, and to output broadcast program data of the selected broadcast program.

Still another arrangement of the present invention further comprises informing means for, when the reception means cannot receive a good broadcast wave of the broadcast waves of the plurality of broadcast programs indicated by the remaining selecting program data, informing that the reception conditions of the broadcast waves of the plurality of broadcast programs indicated by the remaining selecting program data are not good.

Still another arrangement of the present invention comprises: reception means capable of receiving broad cast waves; selecting means for selecting a broadcast wave of one broadcasting channel from the broadcast waves received by the reception means; storage means for storing a plurality of sets of selecting program data each having channel number data indicating a broadcasting channel and broadcast program data indicating a broadcast program to be broadcasted by the broadcasting channel in units of a plurality of items defining types of broadcast programs of the broadcast channels to be selected by the selecting means according to a selecting priority order; item designation means for designating one of the plurality of items stored in the storage means; reception condition detection means, responsive to the item designation by the item designation means, for receiving a broadcast wave from a broadcasting channel indicated by the selecting program data having the highest priority in the designated item, and detecting whether or not a reception condition of the broadcast wave is good; and control means, responsive to the detection of the reception condition detection means that the reception condition of the received broadcast wave is good, for controlling the selecting means to select the broadcast wave of the broadcast program indicated by the corresponding selecting program data, and to output broad-cast program data of the selected broadcast program, and for, when the reception condition detection means detects that the reception condition is not good, controlling the selecting means to select a broadcast wave of a broadcast program indicated by the selecting program data having the next priority, and to output broadcast program data of the selected broadcast program.

Still another arrangement of the present invention further comprises informing means for, when the reception condition detection means detects, under the control of the control means, that the reception condition of the broadcast wave of the broadcast program indicated by the selecting program data having the next priority is not good, informing that the reception condition of the broadcast wave is not good.

Still another arrangement of the present invention comprises: reception means capable of receiving broadcast waves; selecting means for selecting a broadcast wave of one broadcasting channel from the broadcast waves received by the reception means; storage means for storing a plurality of sets of selecting program data each having channel number data indicating a broadcasting channel to be selected by the selecting means and broadcast program data indicating a broadcast program to be broadcasted by the broadcasting channel according to a selecting priority order; selecting program designation means for designating one of the plurality of sets of selecting program data stored in the storage means; reception condition detection means for, when the selecting program designation means designates the set of selecting program data, detecting whether or not a reception condition of a broadcast wave from a broadcasting channel indicated by the designated set of the selecting program data is good; and control means for, when the reception condition detection means detects that the reception condition of the broadcast wave is good, controlling the selecting means to select the broadcast wave of the broadcast program indicated by the designated set of selecting program data, and to output broadcast program data of the selected broadcast program, and for, when the reception condition detection means detects that the reception condition is not good, controlling the selecting means to select a broadcast wave of a broadcasting channel indicated by a set of selecting program data having the next priority, and to output broadcast program data of the selected broadcast program.

Still another arrangement of the present invention further comprises informing means for, when the reception condition detection means detects, under the control of the control means, that the reception condition of the broadcast wave of the broadcast program indicated by the set selecting program data having the next priority is not good, informing that the reception condition of the broadcast wave is not good.

Still another arrangement of the present invention comprises: reception means capable of receiving broadcast waves; reception condition detection means for detecting a reception condition of the broadcast waves received by the reception means; and display means for evaluating the reception condition detected by the reception condition detection means, and classifying the evaluated reception condition in one of a plurality of stages, and displaying corresponding reception condition evaluation information according to a classified evaluation stage.

Still another arrangement of the present invention comprises: reception means capable of receiving broadcast waves; reception condition detection means for detecting whether or not a reception condition of the broadcast waves received by the reception means is good; power supply means for supplying electric power to respective units of a broadcast receiving apparatus main body including the reception means; and control means, responsive to the detection of the reception condition detection means that the reception condition of the broadcast waves is not good, for controlling to stop supplying of the electric power from the power supply means to the respective units of the broadcast receiving apparatus main body.

Still another arrangement of the present invention comprises: reception means capable of receiving broadcast waves; reception condition detection means for detecting whether or not a reception condition of the broadcast waves received by the reception means is good; power supply means for supplying electric power to respective units of a broadcast receiving apparatus main body including the reception means; and control means, responsive to the successive detection, of the reception condition detection means that the reception condition of the broadcast waves is not good, for a predetermined period of time from when the reception condition detection means detects that the reception condition of the broadcast waves is not good, for controlling to stop supplying of the electric power from the power supply means to the respective units of the broadcast receiving apparatus main body.

Still another arrangement of the present invention comprises: reception means capable of receiving broadcast waves; reception condition detection means for detecting whether or not a reception condition of the broadcast waves received by the reception means is good; power supply means for supplying electric power to respective units of a broadcast receiving apparatus main body including the reception means; and control means, responsive to the successive detection, of the reception condition detection means that the reception condition of the broadcast waves is not good, for a predetermined period of time from when the reception condition detection means detects that the reception condition of the broadcast waves is not good, for controlling to stop supplying of the electric power from the power supply means to the respective units of the broadcast receiving apparatus main body, and for, when another predetermined period of time elapses from when the supply of the power supply electric power is stopped, controlling to restart the supply of the electric power from the power supply means to the respective units of the broadcast receiving apparatus main body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view showing the storage content of a memory shown in FIG. 1;

DETAILED DESCRIPTION OF THE PREFERRED EMBODIMENTS

The present invention will be described in detail hereinafter with reference to its preferred embodiments.

FIGS. 1 to 4 show an embodiment of a broadcast receiving apparatus according to the present invention.

Figure 1:
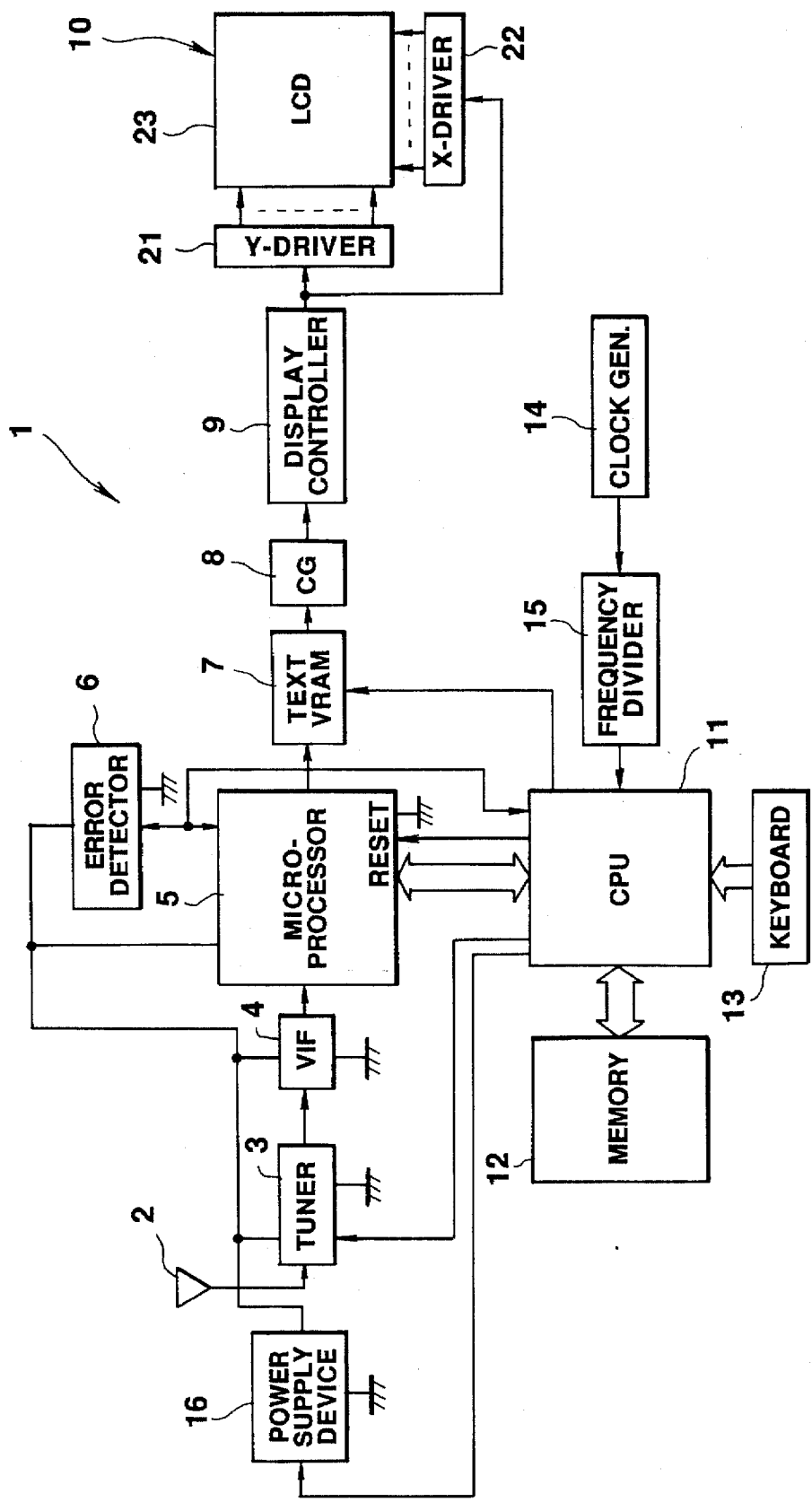
FIG. 1 is a block diagram showing the circuit arrangement of a broadcast receiving apparatus according to one embodiment of the present invention.

FIG. 1 is a block diagram of a broadcast receiving apparatus 1 according to the embodiment of the present invention. The broadcast receiving apparatus 1 comprises an antenna 2, a tuner 3, a VIF (video intermediate frequency circuit) 4, a microprocessor 5, an error detector 6, a text VRAM (video RAM) 7, a CG (character generator) 8, a display controller 9, a display 10, a CPU 11, a memory 12, a keyboard 13, a clock generator 14, a frequency divider 15, and a power supply device 16. This broadcast receiving apparatus 1 can receive broadcast waves for repetitively broadcasting a program of a teletext and a specific item.

The power supply device 16 converts a power supply voltage from an external power supply or a battery (not shown) into a predetermined voltage, and supplies the converted voltage to the respective units of the broadcast receiving apparatus 1. The power supply device 16 receives a control signal from the CPU 11 via a control line CL1, and starts and stops power supply according to this control signal.

The broadcast receiving apparatus 1 receives broadcast waves by means of the antenna 2. The broadcast waves received by the antenna 2 are supplied to the tuner 3. The tuner 3 is a so-called electronic tuner constituted by coils, capacitors, resistors, and the like, and operates under the control of the CPU 11. The tuner 3 tunes in for or selects an electric wave of a frequency designated by the CPU 11, extracts signals of the designated frequency, and outputs the extracted signals to the VIF 4.

The VIF 4 is constituted by a demodulator, a detector, and the like. The VIF 4 demodulates and detects the signals input from the tuner 3 to extract analog video signals from the input signals.

The microprocessor 5 comprises an A/D converter, a buffer, a decoder, and the like. The microprocessor 5 converts the analog video signals input from the VIF 4 into digital signals by its A/D converter, and stores the digital signals in the buffer. The microprocessor 5 decodes the input signals into character data by its decoder.

The digital signals stored in the buffer of the microprocessor 5 are sequentially read out, and are output to the error detector 6. The error detector 6 detects errors of the input signals, and outputs the number of detected errors to the microprocessor 5 and the CPU 11. As the error detector 6, an error detector used in, e.g., a teletext-multiplied television receiving apparatus may be used when the broadcast receiving apparatus 1 is a teletext receiving apparatus, the error detector 6 detects error correction information in reception signals, thereby detecting error signals.

The text VRAM 7 stores character positions and character sizes on a display screen and stores character codes under the control of the CPU 11.

The CG 8 stores display dot patterns corresponding to various sizes and codes. When data of specific sizes and codes is input from the text VRAM 7 to the CG 8, the CG 8 outputs data of the corresponding display dot patterns to the display controller 9.

The display controller 9 comprises an input order counter and a display position control circuit. The display controller 9 generates position signals and display signals so as to sequentially display a dot pattern string given from the CG 8 from the upper left position toward the lower right position on the display screen, and outputs the generated signals to the display 10. Therefore, the VIF 4, the microprocessor 5, the text VRAM 7, the CG 8, and the display controller 9 serve as signal processing means for executing signal processing of a selected broadcast signal to an output enable state.

The display 10 comprises a Y-driver 21, an X-driver 22, and an LCD (liquid crystal display) 23. The LCD 23 is driven by driving signals from the Y-driver 21 and the X-driver 22. The Y-driver 21 and the X-driver 22 output the driving signals for controlling designated ON/OFF states to the respective coordinates of the LCD 23 on the basis of the position signals and the display signals input from the display controller 9. The LCD 23 has display pixels arranged in a dot-matrix pattern, and the display pixels are turned on (e.g., black display) or turned off (e.g., transparent display) according to the driving signals from the Y-driver 21 and the X-driver 22.

The CPU 11 comprises a microprocessor, a ROM, a RAM, and the like. The ROM stores a program for the broadcast receiving apparatus 1, selectable channel numbers, frequencies corresponding to the channel numbers, and the like. The RAM is utilized as a working memory. The microprocessor in the CPU 11 controls the respective units of the broadcast receiving apparatus 1 according to the program in the ROM to operate them as the broadcast receiving apparatus 1. The CPU 11 outputs a signal for designating to start or stop power supply to the power supply device 16 via the control line CL1 on the basis of the detection result of the error detector 6, thereby controlling to start or stop power supply of the broadcast receiving apparatus 1.

Figure 2:
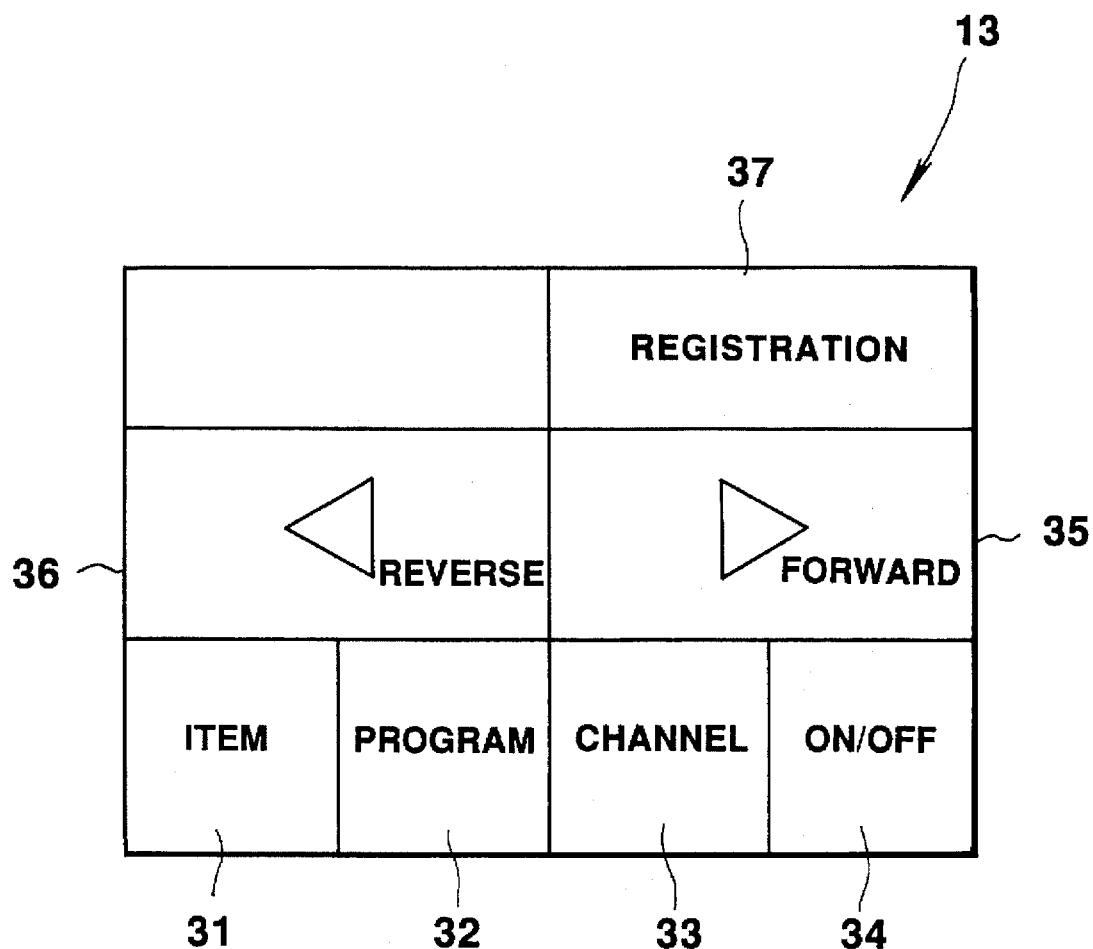
FIG. 2 is a front view of a keyboard of the broadcast receiving apparatus shown in FIG. 1.

As shown in FIG. 2, the keyboard 13 comprises an item selection key 31, a program selection key 32, a channel selection key 33, a power ON/OFF key 34, a forward scroll key 35, a reverse scroll key 36, and the like. A user performs various operations on the broadcast receiving apparatus 1 using the keyboard 13. The user can select in advance an item (e.g., items indicating kinds of programs such as a weather forecast, traffic information, stock price information, news, cooking, and the like) of a program to be selected by the item selection key 31, and can also select a channel of a broadcasting channel by the channel selection key 33. The user can also select a program of each channels by the program selection key 32. The user can turn on/off the power supply of the broadcast receiving apparatus 1 by the power ON/OFF key 34. When the item selection key 31 is depressed, a plurality of items prestored in the ROM of the CPU 11 or a plurality of items registered in the memory 12 (to be described later) can be scrolled in the forward or reverse direction by the scroll key 35 or 36. When the program selection key 32 is depressed, selectable programs can be scrolled by the scroll key 35 or 36. Furthermore, when the channel selection key 33 is depressed, selectable channels can be tuned in by the scroll key 35 or 36. A timer reservation can be made by operating the keys on the keyboard 13. More specifically, a channel and a program are designated in correspondence with a predetermined item to automatically turn on/off the power supply, or the content of a reserved program can be stored in the memory 12.

The memory 12 comprises a RAM, and the like, and stores reservation data and the content of a reserved program. More specifically, as shown in FIG. 3, the memory 12 is divided into areas in units of items, and the area of each item stores a channel number and a program number in correspondence with each other. An item, a channel, and a program can be registered in the memory 12 by operating the keyboard 13. More specifically, when the item selection key 31 is depressed, one item is read out from the ROM, and is displayed on the LCD 23. If the displayed item is not a desired item, the user operates the scroll key 35 or 36 to sequentially switch an item to be displayed when the desired item is displayed, the user selects the item. When an item is selected, the CPU 11 stores the selected item in a predetermined item storage area of the memory 12. When the above-mentioned processing is performed for items to be registered, a plurality of items can be registered in the memory 12. When a channel and a program are registered in correspondence with each item, the user depresses the channel selection key 33 or the program selection key 32, and uses the scroll key 35 or 36 to display a desired channel number or program on the LCD 23. When the desired channel number or program number is displayed on the LCD 23, the user selects the channel number or program number. When an item is selected in correspondence with the selected channel number or program number, a set of the selected channel number and program number are stored in the memory 12 as a reservation program in correspondence with the item. A reception data storage area is also allocated on the memory 12. The reception data storage area stores reception data (program content) of a reservation program in units of, e.g., pages in the teletext.

Note that a method of registering a channel number and program number is not limited to the above-mentioned method. For example, an item may be set first, and a channel number and program number may be sequentially registered in units of items.

The clock generator 14 is a so-called quartz oscillator constituted by a quartz, resistors, capacitors, and the like, and generates an original clock signal of a predetermined frequency.

The frequency divider 15 is formed by, e.g., combining a plurality of stages of binary counters. The frequency divider 15 frequency-divides the original clock signal input from the clock generator 14 to generate 1-Hz clock signals that can be utilized as timepiece reference signals, and outputs the generated clock signals to the CPU 11. The CPU 11 measures the current time based on the clock signals, and utilizes the measured time in various control operations. For example, the CPU 11 causes the LCD 23 to display the current time, and performs ON/OFF-control of the power supply of the broadcast receiving apparatus 1.

The operation of this embodiment will be described below.

The broadcast receiving apparatus 1 performs a time display on the LCD 23 when a broadcast wave is not received.

More specifically, when the ON/OFF key 34 on the keyboard 13 is kept OFF, the broadcast receiving apparatus 1 causes the CPU 11 to measure the current time based on the clock signals input from the frequency divider 15, to determine a display position, and to output the current time information to the corresponding position on the text VRAM 7. The text VRAM 7 outputs the current time information to the display controller 9 through the CG 8, and the current time is displayed at the predetermined position on the LCD 23.

In this state, when the ON/OFF key 34 on the keyboard 34 is turned on, the CPU 11 turns on the power supply, and starts reception processing.

More specifically, when the ON/OFF key 34 is turned on, the CPU 11 outputs a control signal (e.g., an "H" signal) instructing an ON operation to the power supply device 16. Upon reception of the signal instructing the ON operation, the power supply device 16 supplies a power supply voltage to the tuner 3, the VIF 4, the microprocessor 5, and the error detector 6. The CPU 11 outputs a reset signal to the reset terminal of the microprocessor 5, and causes the microprocessor 5 to perform initialization processing. Upon completion of the initialization processing, the CPU 11 performs normal reception processing. More specifically, broadcast waves are received by the antenna 2, and the tuner 3 extracts signals of a frequency corresponding to a predetermined channel (e.g., an initially set channel) from the broadcast waves received by the antenna 2. The signals extracted by the tuner 3 are output to the VIF 4. The VIF 4 demodulates and detects the input signals, then selects video signals corresponding to a program designated by the CPU 11, and outputs the selected video signals to the microprocessor 5. The microprocessor 5 converts the video signals into digital signals by its A/D converter, and stores the digital signals for one scan line in the buffer. Then, the microprocessor 5 outputs the stored signals to the error detector 6. The error detector 6 detects error signals. The error detector 6 outputs the number of detected errors to the microprocessor 5 and the CPU 11. When the number of errors falls within an error recovery possible range, the microprocessor 5 decodes the video signals using the internal decoder, and outputs the decoded signals to the text VRAM 7. The text VRAM 7 sequentially outputs character codes and sizes to the CG 8 from the upper left position to the lower right position on the display 23 screen. The CG 8 outputs patterns corresponding to the data supplied from the text VRAM 7 to the display controller 9. The display controller 9 determines display positions and contents, and controls the Y-driver 21 and the X-driver 22. The Y-driver 21 and the X-driver 22 output the driving signals to the LCD 23 to cause it to display the corresponding contents at the corresponding positions.

In this manner, when the ON/OFF key 34 is turned on, the broadcast receiving apparatus 1 causes the LCD 23 to display the content of a preset channel. When the displayed content is not a target content, a viewer or user can change the displayed content by operating the keyboard 13.

A normal change operation of the displayed content is performed by operating the program selection key 32 or the channel selection key 33 on the keyboard 13. More specifically, in order to change a program, the viewer depresses the program selection key 32, and then operates the scroll key 35 or 36, thereby sequentially changing programs. In order to change a channel, the viewer depresses the channel selection key 33, and then operates the scroll key 35 or 36, thereby changing the channel. At this time, the CPU 11 outputs the selected channel number to the tuner 3 to cause it to extract the electric wave of the corresponding channel, and outputs the selected program to the microprocessor 5 to cause it to select video signals corresponding to the selected program, and then to perform decoding and display processing. When the program of the desired channel is displayed, the viewer completes selection.

However, when a program of a specific item is repetitively broadcasted as different programs in a plurality of channels like in the teletext, the above-mentioned tuning method requires too many operations to tune in for a program of a desired item, resulting in cumbersome operations. In addition, when the reception condition of the electric wave having the selected program is poor, the viewer must perform the same operations again to tune in to the next channel that broadcasts the same item, and a corresponding program, resulting in cumbersome tuning operations.

Thus, in the broadcast receiving apparatus 1 of this embodiment, when the item selection key 31 and the scroll key 35 or 36 are operated to designate a target item, channels and programs registered in advance in the memory 12 in correspondence with the item are tuned in according to a predetermined order. When the reception condition is poor, the next channel and program are automatically tuned.

Figure 4:
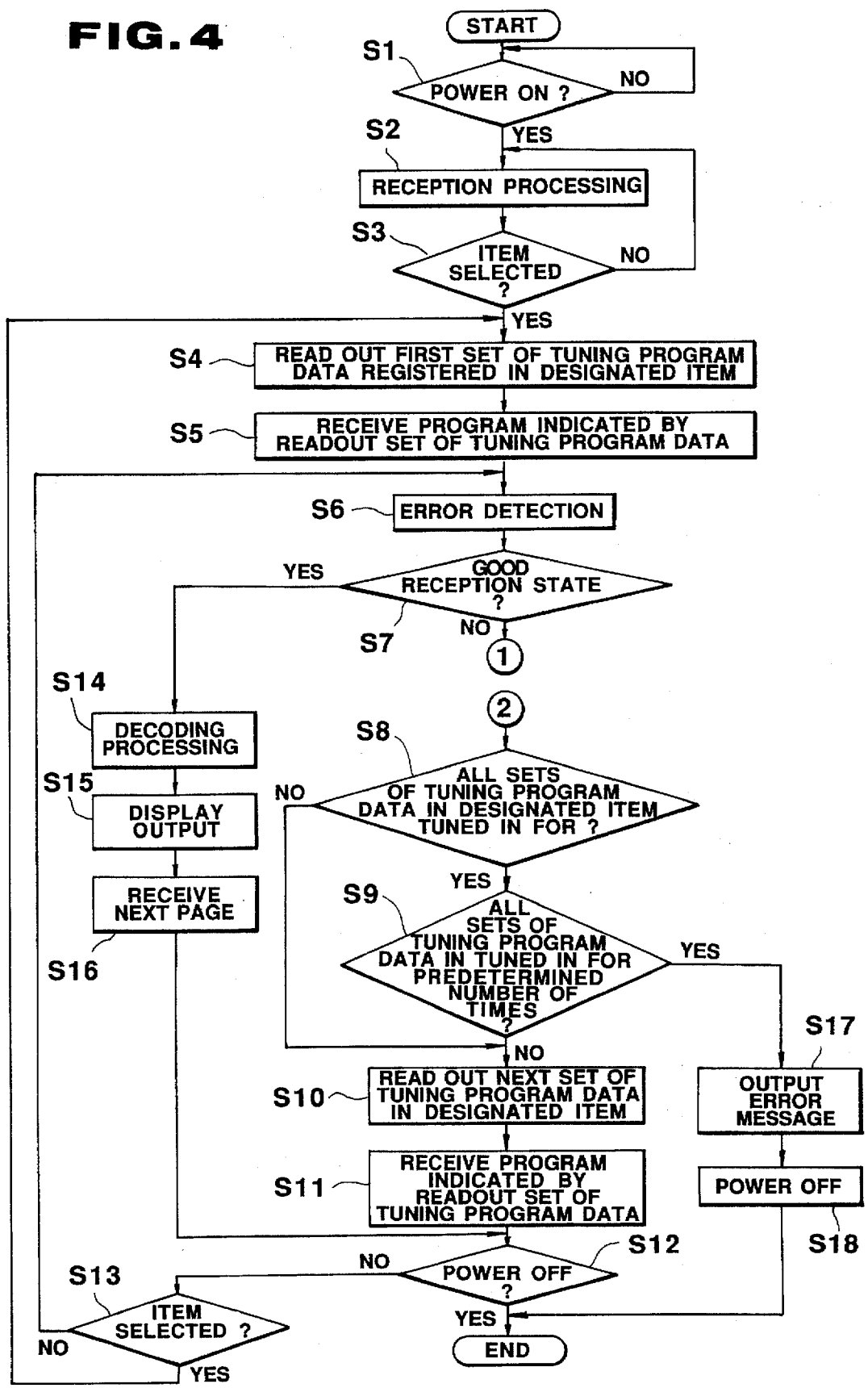
FIG. 4 is a flow chart showing the operation of a CPU shown in FIG. 1.

More specifically, as shown in FIG. 4, when the ON/OFF key 34 on the keyboard 13 is turned on (step S1), the CPU 11 performs normal reception processing (step S2), and checks if an item is selected by the item selection key 31 and the scroll key 35 or 36 (step S3). If NO in step S3, the CPU 11 continues the normal reception processing; otherwise, the CPU 11 reads out a set of tuning program data registered in correspondence with the selected item from the memory 12 in a predetermined order, e.g., in a registration order (step S4). The CPU 11 performs reception of the corresponding program on the basis of the readout set of tuning program data (step S5), and causes the error detector 6 to detect error signals (step S6).

The CPU 11 then discriminates based on error count information input from the error detector 6 whether or not the reception condition of the received program is good (step S7). If NO in step S7, the flow executed by the CPU 11 advances to steps S6-1 to S6-5 in FIG. 5 and returns to step S8 in FIG. 4 to check if all the sets of tuning program data registered in the designated item are received (tuned in for). Operations of steps S6-1 to S6-5 will be described later.

If NO in step S8, the flow advances to step S10. If YES in step S8, the CPU 11 checks if a program indicated by each of all the sets of tuning program data registered in the designated item is tuned in for a predetermined number of times (e.g., three times) (step S9). If NO in step S9, the CPU 11 reads out the next set of tuning program data in the designated item from the memory 12 (step S10), and performs reception of the corresponding program on the basis of the readout set of tuning program data (step S11).

When the reception of a program indicated by the next set of tuning program data is started, the CPU 11 checks if the power supply is turned off (step S12). If YES in step S12, the CPU 11 ends the processing. If NO in step S12, the CPU 11 checks if another item is selected (step S13). If NO in step S13, the flow returns to step S6 to perform error detection of the received program in the same manner as described above.

The CPU 11 repetitively executes the abovementioned processing until a program in a good reception condition is received or until a program indicated by each of all the sets of tuning program data in the designated item is tuned in for the predetermined number of times. If it is determined in step S7 that the reception condition is good, character decoding processing is performed (step S14), and decoded character data is displayed on the LCD 23 through the text VRAM 7, the CG 8, and the display controller 9 (step S15). Thereafter, the CPU 11 performs reception processing of the next page (step S16), and then checks if the power supply is turned off (step S12) and if another item is selected (step S13). If NO in steps S12 and S13, the flow returns to step S6 to perform error detection of the next page. More specifically, even when the automatic tuning operation is interrupted after it is determined that the reception condition is good, the reception condition is always checked. When the reception condition is worsened during reception, the automatic tuning operation can be restarted.

During the automatic tuning operation, when it is determined in step S9 that programs indicated by all the sets of tuning program data in the designated item have been tried to be tuned in for the predetermined number of times, the CPU 11 causes the LCD 23 to display an error message indicating that there is no program in a good reception condition in the designated item (step S17). After an elapse of a predetermined period of time, the CPU 11 turns off the power supply, and ends processing (step S18). As the message, for example, a message "Cannot select a program corresponding to the designated item due to a poor reception condition", or the like is displayed. In this case, a message for urging the viewer to designate another item may be displayed without immediately turning off the power supply, and when no item is designated after an elapse of a predetermined period of time, the power supply may be turned off.

In this manner, when sets of tuning program data are registered in advance in units of items, the viewer need only designate an item to be watched so as to automatically tune in for a program in a good reception condition of the programs registered in correspondence with the selected item. Therefore, a program of an item to be received can be quickly and easily tuned in for without repeating cumbersome tuning operations. As a result, the operability and convenience upon tuning can be improved without arranging many preset keys on the broadcast receiving apparatus 1. In addition, necessary information can be quickly acquired, thus improving portability and utility of the broadcast receiving apparatus 1.

In step S6 described above, when the CPU 11 receives the error count information from the error detector 6, it counts the number of errors per unit time, and calculates the ratio of errors to all the reception signals, i.e., a total data amount per unit time. Upon completion of the ratio of errors to all the reception signals per unit time, the CPU 11 discriminates to which stage of reception condition evaluation, which is divided in advance into a plurality of stages, the error ratio belongs. The CPU 11 outputs reception condition evaluation information indicating the corresponding stage to the text VRAM 7 as display data. The display data of the reception condition evaluation information output from the CPU 11 is output from the text VRAM 7 to the CG 8, and is then displayed on the LCD through the display controller 9.

Figure 5:
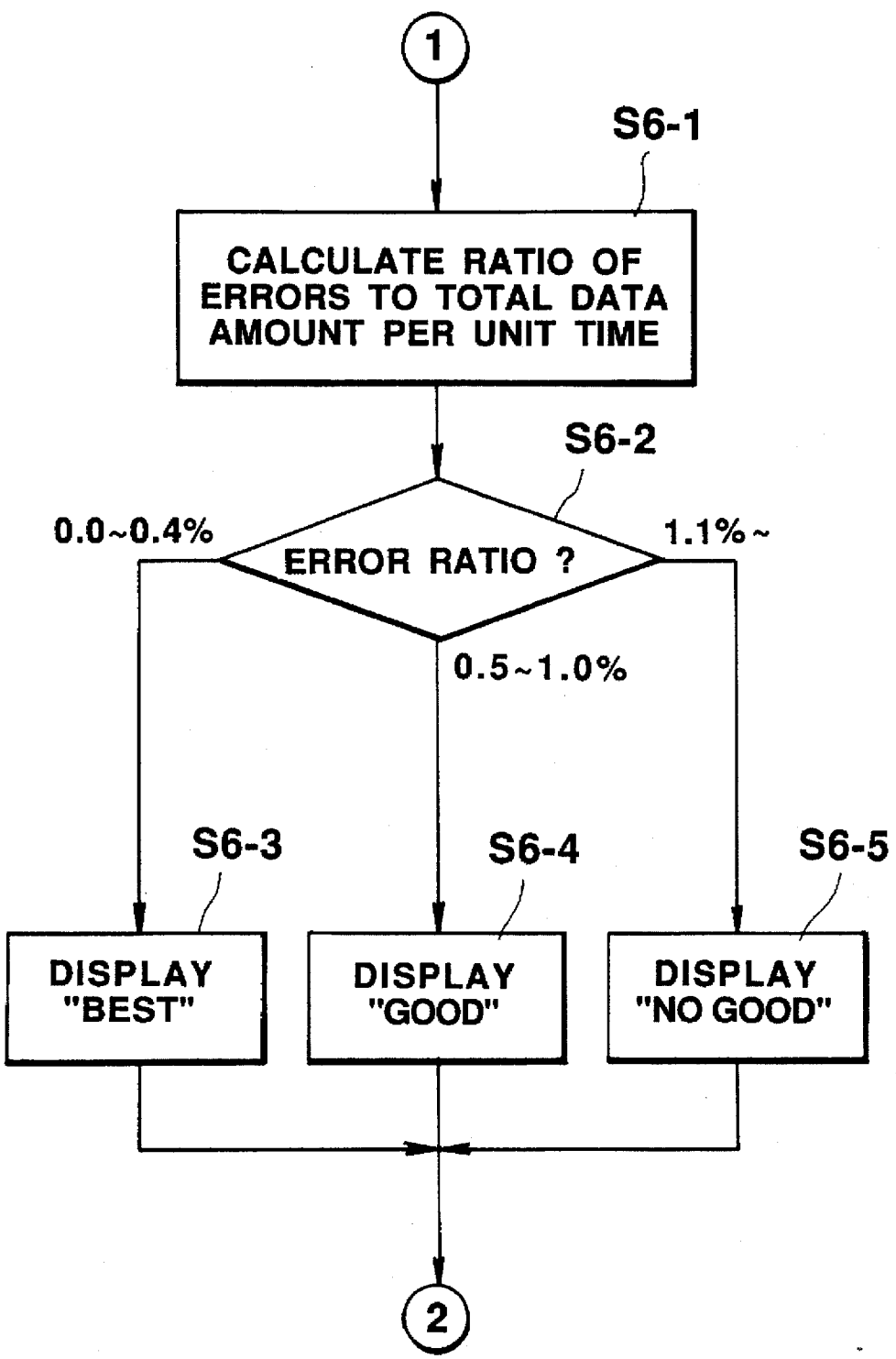
FIG. 5 is a flow chart showing processing executed when an error is detected.

More specifically, as shown in FIG. 4, when the error detector 6 detects the number of errors (step S6), the CPU 11 calculates the ratio of errors to the total reception data amount per unit time on the basis of the detection result (step S6-1), as shown in FIG. 5, and checks the calculated ratio of errors to the total reception data amount (step S6-2). More specifically, the CPU 11 checks to which stage of reception condition evaluation, which is divided in advance into a plurality of stages, the error ratio belongs (step S6-2). The error ratio corresponding to each reception condition evaluation stage is set in advance, and is written in, e.g., the ROM of the CPU 11. For example, the reception condition evaluation is divided into three stages, i.e., a "best" condition, a "good" condition, and "no good" condition. The ratios of errors to the total reception data amount in the respective reception condition evaluation stages are 0.4% or less for the "best" condition, 0.5% to 1.0% for the "good" condition, and 1.1% or higher for the "no good" condition.

If the error ratio calculated in step S6-1 is 0.4% or less, the CPU 11 determines that the reception condition is the "best" condition, and causes the LCD 23 to display a message indicating the "best" condition (step S6-3). If the error ratio falls within the range between 0.5% and 1.0%, the CPU 11 determines that the reception condition is the "good" condition, and causes the LCD 23 to display a message indicating the "good" condition (step S6-4). Furthermore, if the error ratio is 1.1% or higher, the CPU 11 determines that the reception condition is the "no good" condition, and causes the LCD 23 to display a message indicating the "no good" condition (step S6-5).

The reception condition evaluation information may always be displayed in a small size at a predetermined position on the LCD 23. Alternatively, reception condition evaluation processing may be performed for only a predetermined period of time when the power switch is turned on or a channel is switched, and the reception condition evaluation information may be displayed on the LCD 23. When a predetermined operation for requesting to display the reception condition evaluation information is made at the keyboard 13, the reception condition evaluation processing may be performed, and the reception condition evaluation result may be displayed on the LCD 23. Furthermore, the output format of the reception condition evaluation information is not limited to a visual display on the LCD 23. For example, a speech such as "best", "good", or the like may be output. In addition, the display and speech outputs of the reception condition evaluation information may be simultaneously performed.

Therefore, the viewer can quickly and adequately know the current reception condition on the basis of the reception condition evaluation information output from the broadcast receiving apparatus 1, and can quickly tune in to a channel in a good reception condition. As a result, the viewer can quickly and adequately acquire necessary information.

Figure 6:
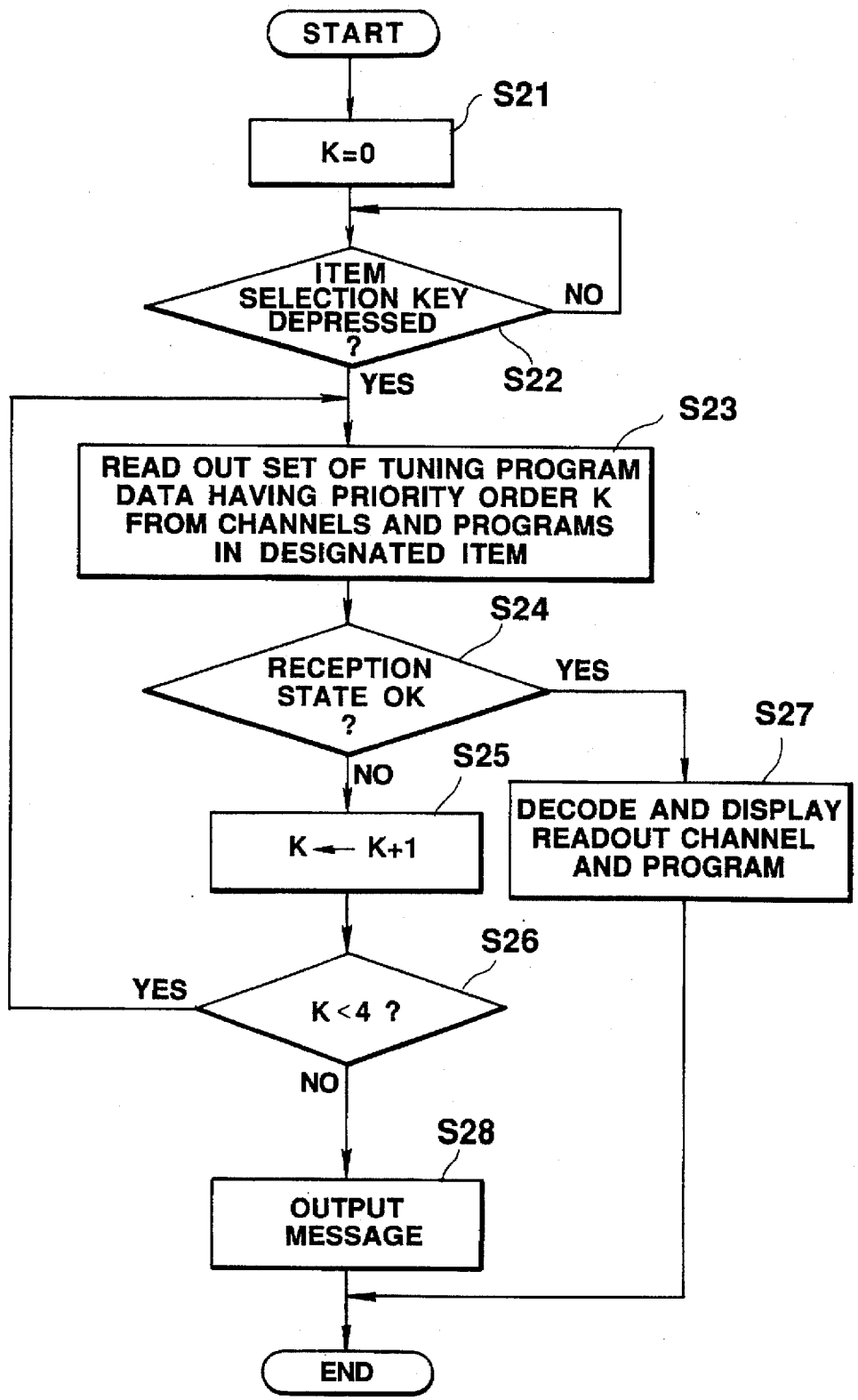
FIG. 6 is a flow chart showing processing according to another embodiment of the present invention.

FIG. 6 shows a flow chart illustrating operations of another embodiment of the present invention. The arrangement of this embodiment is similar to that of the first embodiment of the FIGS. 1 to 3.

When a program of a specific item is repetitively broadcasted as different programs in a plurality of channels like in the teletext, the above-mentioned tuning method requires too many operations to tune in for a program of a desired item, resulting in cumbersome operations. In addition, when the reception condition of the selected program is poor, the viewer must perform the same operations again to tune in to the next channel that broadcasts the same item, and a corresponding program, resulting in cumbersome tuning operations.

Thus, in a broadcast receiving apparatus 1 of this another embodiment, when an item selection key 31 is depressed, and a target item is designated by operating scroll key 35 or 36, a channel and a program registered in advance in a memory 12 in correspondence with the item are tuned in according to a priority order. When the reception condition of the tuned program is poor, a channel and a program having the next priority are automatically tuned in. Upon selection in the priority order, a channel and a program, which had a good reception condition as a result of a previous tuning operation, may be stored as a set of tuning program data in the memory 12. The content of the memory 12 can be updated every time a tuning operation is performed.

As shown in FIG. 6, a CPU 11 resets a variable K indicating the priority order of sets of tuning program data each having a channel and a program to be read out from the memory 12 by initialization processing in response to an ON event of an ON/OFF key 34 on a keyboard 13 (step S21). Thereafter, the CPU 11 checks if the item selection key 31 is depressed, and an item is selected using the scroll key 35 or 36 (step S22). If the item selection key 31 is depressed, the CPU 11 reads out a set of tuning program data including a channel number and a program corresponding to the variable K from the sets of tuning program data of channel numbers and programs in the selected item area in the memory 12 (step S23). Since the item selection key has been just depressed for the first time, the priority order K is set to be "0", and the CPU 11 reads out a set of tuning program data having a channel number and a program corresponding to the first priority order from the memory 12. The CPU 11 checks based on error count information input from an error detector 6 if the reception condition of the readout channel number and program is good (step S24). If NO in step S24, the CPU 11 increments the variable K by 1 (step S25), and then checks if the variable K is smaller than 4 (step S26). More specifically, in this embodiment, a maximum of four sets of tuning program data can be registered in correspondence with each item, and it is checked in step S26 if the reception conditions of the four sets of tuning program data, which can be registered, are checked. If it is determined in step S26 that the variable K is smaller than 4, it is determined that the reception conditions of programs indicated by all the sets of tuning program data are not checked yet, and the flow returns to step S23 to read out a channel number and a program corresponding to the next priority order from the memory 12 (step S23). The reception condition of the readout channel number and program is similarly checked (step S24). If the reception condition is not good, the same processing as described above is repeated (steps S25, S26, S23, and S24).

If it is determined in step S24 that the reception condition is good, video signals of the readout channel number and program are decoded, and are displayed on an LCD 23, thus ending the processing (step S27). Therefore, a viewer need only depress the item selection key 31, and select a desired item using the scroll key 35 or 36, so that a program in the item designated by the viewer can be tuned in for according to the priority order registered in advance in the memory 12. When the reception condition of the selected program is poor, another program is selected by sequentially decreasing the priority order, and a program of a channel in a good reception condition can be displayed. As a result, even when the reception condition of a program selected first is poor, a program in the target item can be selected according to the predetermined priority order without repeating cumbersome tuning operations, thus improving the operability of the broadcast receiving apparatus 1.

If it is determined in step S26 that the variable K equals or exceeds 4, a predetermined message is displayed on the LCD 23, and the processing is ended (step S28). As the message, for example, a message "Cannot select a program corresponding to the designated item due to a poor reception condition", or the like is displayed. In this case, the message may be output as speech data in addition to a visual display on the LCD 23.

In this embodiment, the item is used as a main selection item, and channel numbers and programs are registered as sets of tuning program data in units of items. However, the present invention is not limited to this. For example, only channel numbers and programs may be registered as sets of tuning program data, and when the scroll key 35 or 36 on the keyboard 13 is depressed in a reception mode, the registered sets of tuning program data may be sequentially selected according to a priority order. When a set of tuning program data in a good reception condition is selected, the corresponding program may be displayed.

In this embodiment, a maximum of four sets of tuning program data can be registered, and selection processing is sequentially performed up to the fourth pair. However, the number of pairs to be registered is not limited to this, as a matter of course.

In this embodiment, when the item selection key on the keyboard 13 is depressed, and an item is selected using the scroll key 35 or 36, the automatic tuning operation of a program is started. However, the present invention is not limited to this. For example, when the power supply is turned on by the ON/OFF key 34 on the keyboard 13, the automatic tuning operation may be started on the basis of a preset item.

Figure 7:
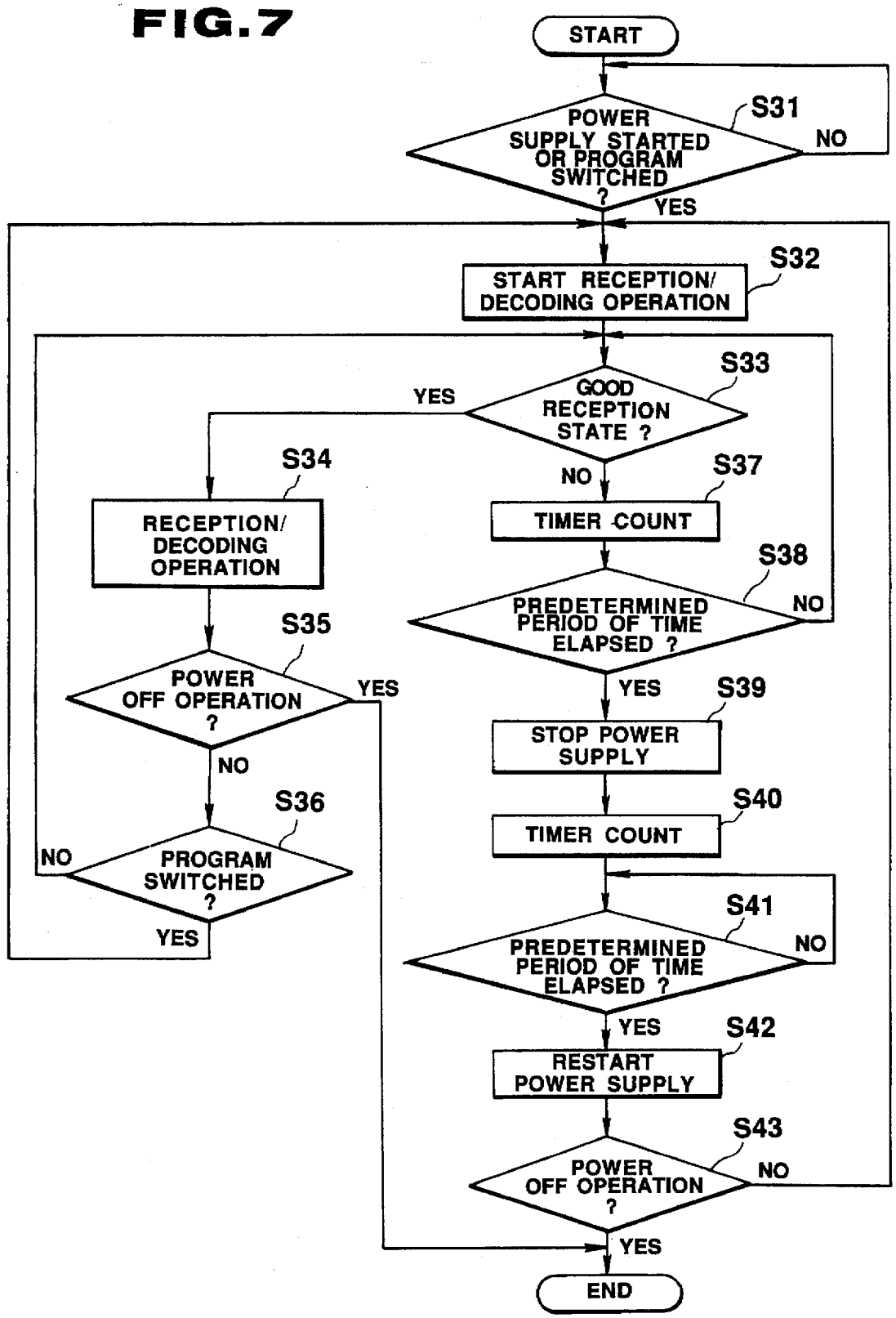
FIG. 7 is a flow chart showing processing according to still another embodiment of the present invention.

FIG. 7 shows a flow chart illustrating operations of a still another embodiment of the present invention. The structure of this embodiment is similar to that of the first embodiment.

In this embodiment, when the reception condition is poor, a power supply is turned off to save power consumption in consideration of the fact that when reception is continued regardless of the poor reception condition of a received broadcast program, electric power is wasted.

More specifically, as shown in FIG. 7, a CPU 11 checks if power supply is started or a program is switched (step S31). When the power supply is started or a program is switched, the CPU 11 controls a tuner 3 and a microprocessor 5 to start a reception operation of a selected program (step S32). Parallel to this reception operation, an error detector 6 performs error detection, as described above, and outputs the number of detected errors to the CPU 11 and the microprocessor 5. The CPU 11 checks based on the number of errors input from the error detector 6 if the reception condition is good (step S33). The criterion for judging whether or not the reception condition is good may be set in advance in, e.g., a ROM of the CPU 11, or may be set by operating keys on a keyboard 13.

If it is determined in step S33 that the reception condition is good, the CPU 11 continues the reception operation (step S34), and checks if the power supply is turned off, i.e., if a power OFF operation is made by a power ON/OFF key 34 on the keyboard 13 (step S35). If YES in step S35, the CPU 11 ends the processing. However, if NO in step S35, the CPU 11 checks if a program is switched (step S36). If YES in step S36, the flow returns to step S32 to repeat the same processing; otherwise, the flow returns to step S33 to check if the reception condition is good.

If it is determined in step S33 that the reception condition is poor, the CPU 11 starts a timer count operation (step S37), and then checks if a predetermined period of time has elapsed (step S38). If NO in step S38, the flow returns to step S33 to check if the reception condition is good, i.e., if the reception condition is recovered. If the reception condition is not recovered, the CPU 11 continues the timer count operation (step S37), and checks if the predetermined period of time has elapsed (step S38). If YES in step S38, the CPU 11 instructs a power supply device 16 to stop power supply, thereby stopping power supply to the tuner 3, a VIF 4, the microprocessor 5, the error detector 6, and the like (step S39).

When the CPU 11 stops the power supply, it starts a timer count operation (step S40), and checks if a predetermined period of time has elapsed (step S41). If YES in step S41, the CPU 11 instructs the power supply device 16 to restart power supply, thereby restarting the power supply to the tuner 3, the VIF 4, the microprocessor 5, the error detector 6, and the like (step S42). When the power supply is restarted, the CPU 11 checks if a power OFF operation is performed (step S43). If NO in step S43, the flow returns to step S32 to start a reception operation and a decoding operation. Thereafter, the CPU 11 repeats the same processing as described above so as to control to stop and start power supply on the basis of the reception condition. If it is determined in step S43 that a power OFF operation is performed, the CPU 11 ends processing.

In this manner, since power supply can be controlled to be stopped or started on the basis of the reception condition, unnecessary electric power can be prevented from being kept supplied in a poor reception condition, thus saving power consumption. In particular, in a broadcast receiving apparatus 1 which can receive a teletext, reception processing and storage processing of a broadcast program for a long period of time in a poor reception condition can be prevented, thus further saving power consumption.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A broadcast receiving apparatus comprising:
   reception means for receiving broadcast waves;
   first storage means for storing as received data broadcasting signals received by said reception means;
   display means for displaying the received data stored in said first storing means;
   first designating means for, prior to reception of the broadcasting signals, designating a plurality of items indicative of types of broadcasting programs, and designating a plurality of selection programs indicative of broadcasting channels corresponding to the types of designated broadcasting programs;
   second storing means for storing a plurality of program selection data corresponding to an association between broadcasting channel data indicative of broadcasting channels and broadcasting program data indicative of broadcasting programs, in accordance with designations made by said first designating means;
   second designating means for designating one of the plurality of program selection data stored in said second storing means in accordance with a user's designation;
   reception control means for controlling said reception means to read one of the plurality of program selection data when designated in accordance with the designation operation by said second designating means, and to receive broadcasting signals of one broadcast program specified by broadcasting channel data and broadcast program data included in said one program selection data;
   reception condition detecting means for detecting whether or not a reception condition of the broadcasting signal of said one broadcast program received and controlled by said reception means is acceptable;
   first control means for, when said reception condition detecting means detects that said reception condition of the broadcasting signal of said one broadcast program is acceptable, controlling said first storage means to store the broadcasting signal of the broadcast program as the received data, and for controlling said display means to display the received data; and
   second control means for, when said reception condition detecting means detects that said reception condition of broadcasting signal of said one broadcast program is not acceptable, controlling said reception means to read the other program selection data of the plurality of program selection data included in the same item, instead of controlling said second storing means to store the broadcasting waves of the broadcast program as received data, said second control means controlling said reception means to receive broadcasting waves of the other one broadcast program specified by broadcasting channel data and broadcast program data included in the other program selection data, controlling said reception condition detecting means to detect whether or not a reception condition of the broadcasting waves of the other one broadcast program received by said reception means is acceptable, and controlling said reception means to repeat reading of the other one program selection data and receiving the broadcasting signal of the other one broadcast program specified by broadcasting channel data and broadcast program data included in the other one program selection data until said reception condition of broadcasting waves of the other one broadcast program received by said reception means is detected to be acceptable.

2. A broadcast receiving apparatus according to claim 1, further comprising informing means for, when said reception condition detecting means detects that the reception condition of the broadcasting signals is not acceptable, informing a user that the reception condition is not acceptable.

3. An apparatus according to claim 1, further comprising display means for evaluating the reception condition detected by said detection means, and for classifying the evaluated reception condition in one of a plurality of stages, and for displaying corresponding reception condition evaluation information according to a classified evaluation stage.

4. A method for receiving broadcasting signals of one broadcast program specified by a combination of one of a plurality of broadcasting channels and one of a plurality of broadcasting programs each designated by a user in advance of receipt of the broadcasting signals to correspond to one of a plurality of types of broadcasting programs comprising:
   storing, prior to reception of a the broadcasting signal, broadcasting channel data indicative of broadcasting channels corresponding to the designated type of broadcasting program, together with broadcasting program data indicative of broadcasting programs broadcast by the corresponding broadcasting channels, designated by the user, as a plurality of program selection data;

receiving one of the plurality of program selection data to be read when said one program selection data is designated by the user, and controlling broadcasting signals of one broadcast program specified by broadcasting channel data and broadcast program data included in the one program selection data to be received;

detecting whether a reception condition of the broadcasting signals of said one broadcast program received is acceptable;

controlling, when it is detected in said detecting step that the reception condition of the broadcasting signals of said one broadcast program is acceptable, controlling the broadcasting signals of said one broadcast program to be stored as received data, and for controlling the received data to be displayed; and controlling, when it is detected in said reception condition detecting step that the reception condition of the broadcasting signals of said one broadcast program is not acceptable, the other program selection data in the plurality of program selection data included in said same item so as to be read, instead of controlling the broadcasting signals of said one broadcast program so as to be stored as received data, and controlling broadcasting signals of the other one broadcast program specified by broadcasting channel data and broadcast program data included in the other program selection data so as to be read, subjecting the other one broadcast program to a detection of whether or not a reception condition of the broadcasting signals of the other one broadcast program is acceptable, and controlling the other program selection data so as to be repeatedly read, and the broadcasting waves of the other broadcast program specified by broadcasting channel data and broadcast program data included in the other program selection data so as to be repeatedly received, until said reception condition of the broadcasting waves of the other one broadcast program is detected to be acceptable.

* * * * *